(12) United States Patent  
Khan et al.

(10) Patent No.: US 9,251,060 B2
(45) Date of Patent: Feb. 2, 2016

(54) COMPRESSION-ENABLED BLENDING OF DATA IN NON-VOLATILE MEMORY

(75) Inventors: Jawad B. Khan, Cornelius, OR (US); Richard L. Coulson, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 218 days.

(21) Appl. No.: 13/996,173

(22) PCT Filed: Mar. 29, 2012

(86) PCT No.: PCT/US2012/031315
§ 371 (c)(1),
(2), (4) Date: Jun. 20, 2013

(87) PCT Pub. No.: WO2013/147819
PCT Pub. Date: Oct. 3, 2013

(65) Prior Publication Data
US 2014/0250257 A1   Sep. 4, 2014

(51) Int. Cl.
*G06F 12/02* (2006.01)
*G11C 16/10* (2006.01)
*G11C 11/56* (2006.01)
*G06F 11/10* (2006.01)

(52) U.S. Cl.
CPC ........ *G06F 12/0246* (2013.01); *G06F 11/1012* (2013.01); *G11C 11/5628* (2013.01); *G11C 16/10* (2013.01); *G06F 12/0253* (2013.01)

(58) Field of Classification Search
CPC ............ G06F 12/0246; G06F 12/0253; G06F 11/1012; G11C 11/5628; G11C 16/10
USPC .................................. 711/103, 170, E12.001
See application file for complete search history.

(56) References Cited

U.S. PATENT DOCUMENTS

| 8,533,558 | B2 * | 9/2013 | Yurzola et al. ................ 714/758 |
| 8,862,841 | B2 * | 10/2014 | Fineberg ............ G06F 11/1451 711/162 |
| 2008/0235441 | A1 | 9/2008 | Sherman |
| 2010/0011150 | A1 | 1/2010 | Klein |
| 2010/0281340 | A1 * | 11/2010 | Franceschini ....... G06F 12/0246 711/154 |

(Continued)

OTHER PUBLICATIONS

International Preliminary Report on Patentability for corresponding PCT/US2012/031315, mailed Oct. 9, 2014, 5 pages.

(Continued)

*Primary Examiner* — Pierre-Michel Bataille
(74) *Attorney, Agent, or Firm* — Schwabe, Williamson & Wyatt, P.C.

(57) ABSTRACT

Described herein are embodiments of an apparatus configured for compression-enabled blending of data, a system including the apparatus configured for compression-enabled blending of data, and a method for compression-enabled blending of data. An apparatus configured for compression-enabled blending of data may include non-volatile memory configured to operate in a single-level cell mode and a multi-level cell mode, a compression module configured to compress data to generate compressed data, and a memory controller configured to write, in response to a reduction ratio of the compressed data being less than a threshold compression ratio, a first portion of the compressed data to the non-volatile memory in the single-level cell mode, and a second portion of the compressed data to the non-volatile memory in the multi-level cell mode. Other embodiments may be described and/or claimed.

25 Claims, 5 Drawing Sheets

(56) References Cited

U.S. PATENT DOCUMENTS

2011/0145486 A1 6/2011 Owa et al.
2011/0154160 A1 6/2011 Yurzola et al.
2013/0254441 A1* 9/2013 Kipnis et al. .................... 710/68

OTHER PUBLICATIONS

International Search Report and Written Opinion for PCT/US2012/031315, mailed Nov. 23, 2012, 8 pages.

* cited by examiner

COMPRESSION-ENABLED BLENDING OF DATA IN NON-VOLATILE MEMORY

CROSS REFERENCE TO RELATED APPLICATION

The present application is a national phase entry under 35 U.S.C. §371 of International Application No. PCT/US2012/031315, filed Mar. 29, 2012, entitled "COMPRESSION-ENABLED BLENDING OF DATA IN NON-VOLATILE MEMORY," which designates, among the various States, the United States of America, and the entire contents and disclosures of which are hereby incorporated by reference in their entireties.

TECHNICAL FIELD

Embodiments of the present disclosure relate generally to the field of memory management, and more particularly, to methods, apparatuses, computer-readable media, and systems for storing data in non-volatile memory.

BACKGROUND

Some solid-state devices may include non-volatile memory having single level memory cells, multi-level memory cells, triple-level memory cells, or memory cells with more than three levels. Although multi-level and triple-level non-volatile memory mode may have a larger storage capacity than single-level non-volatile memory mode, read and write access times for multi-level and triple-level non-volatile memory are longer than single-level non-volatile memory mode. In addition, multi-level and triple-level non-volatile memory mode may offer less memory endurance relative to single-cell non-volatile memory mode.

BRIEF DESCRIPTION OF THE DRAWINGS

Embodiments of the present disclosure will be described by way of example embodiments, but not limitations, illustrated in the accompanying drawings in which like references denote similar elements, and in which.

Figure 1:
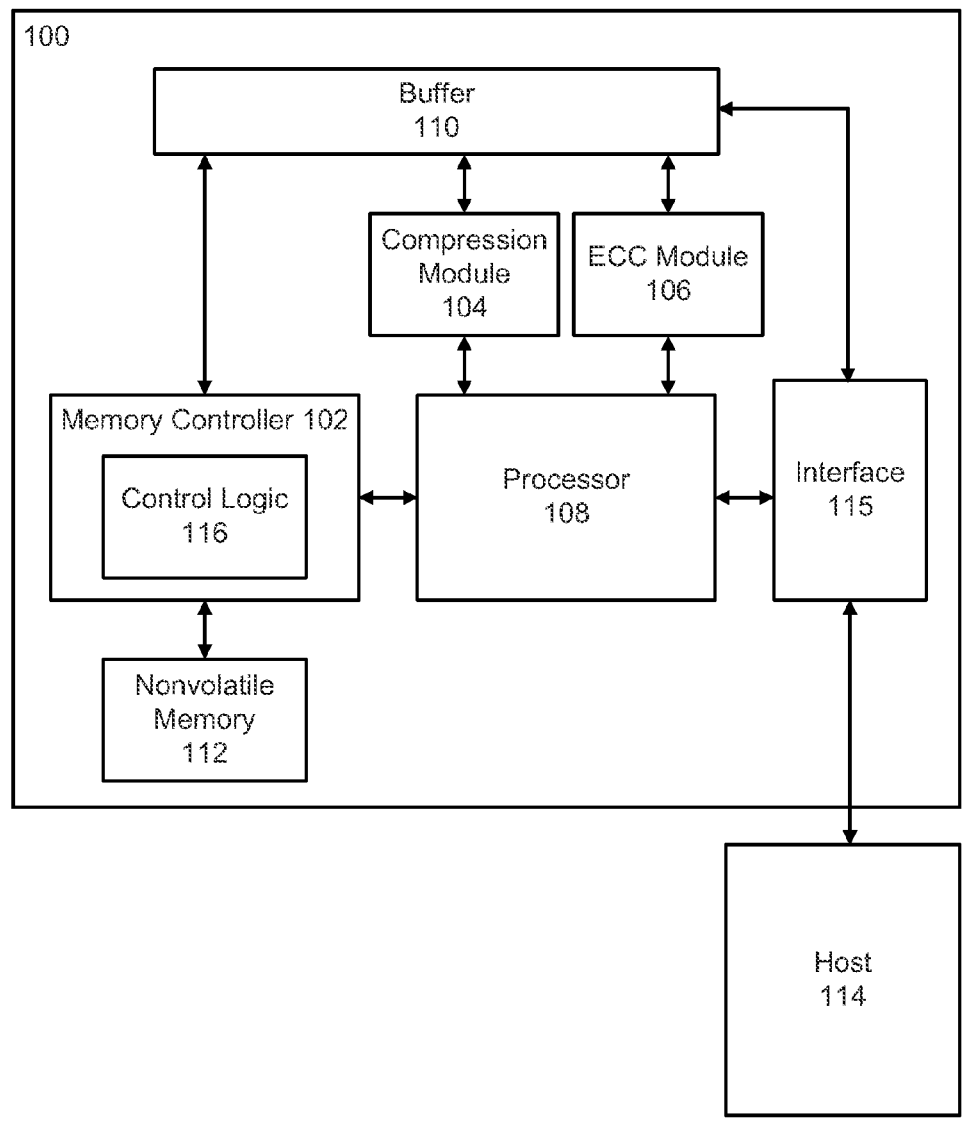
FIG. 1 illustrates a system including a storage device configured for compression-enabled blending of data.

all in accordance with embodiments of the present disclosure.

DETAILED DESCRIPTION

Described herein are embodiments of an apparatus configured for compression-enabled blending storage of data in non-volatile memory, a system including the apparatus configured for compression-enabled blending storage of data in non-volatile memory, and a method for compression-enabled blending storage of data in non-volatile memory.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various aspects of the illustrative implementations are described herein using terms commonly employed by those skilled in the art to convey the substance of their work to others skilled in the art. It will be apparent to those skilled in the art, however, that embodiments of the present invention may be practiced with only some of the described aspects. For purposes of explanation, specific numbers, materials and configurations are set forth in order to provide a thorough understanding of the illustrative implementations. It will be apparent to one skilled in the art, however, that embodiments of the present invention may be practiced without the specific details. In other instances, well-known features are omitted or simplified in order not to obscure the illustrative implementations.

Further, various operations are described as multiple discrete operations, in turn, in a manner that is most helpful in understanding the illustrative embodiments; however, the order of description should not be construed as to imply that these operations are necessarily order dependent. In particular, these operations need not be performed in the order of presentation. Moreover, methods within the scope of this disclosure may include more or fewer steps than those described.

For the purposes of the present disclosure, the phrase "A and/or B" means (A), (B), or (A and B). The phrase "A/B" means (A), (B), or (A and B), similar to the phrase "A and/or B". The phrase "at least one of A, B and C" means (A), (B), (C), (A and B), (A and C), (B and C) or (A, B and C). The phrase "(A) B" means (B) or (A and B), that is, A is optional.

The description may use the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various entities may be introduced and described with respect to the operations they perform. It will be understood that these entities may include hardware, software, and/or firmware elements that are cooperatively configured to provide the described operations.

Embodiments of the present disclosure describe compression-enabled blending of data in memory. As will be shown, this compression-enabled blending of data may be provided by a compression module configured to compress data to generate compressed data, and a memory controller configured to write, in response to a reduction ratio of the compressed data being less than a threshold compression ratio, a first portion of the compressed data to the memory in the single-level cell mode, and a second portion of the compressed data to the memory in the multi-level cell mode. In various embodiments, compression-enabled blending may increase the speed and/or endurance of solid-state drives relative to conventional methods of data storage.

FIG. 1 illustrates a device 100 in accordance with some embodiments. In various embodiments, the device 100 may be a storage device. The device 100 may include a memory controller 102, a compression module 104, an error-correction code (ECC) module 106, a processor 108, and a data buffer 110. The memory controller 102 may be coupled with a nonvolatile memory (NVM) 112 and may include a control logic block 116 configured, among other things, to enable the memory controller 102 to perform various operations of the compression-enabled blending of data described herein.

One or more aspects of the control logic 116, the compression module 104, and the ECC module 106 may be implemented in hardware or firmware. In various embodiments, one or more of the operations of the control logic 116, the compression module 104, and the ECC module 106 may be implemented in hardware, software, and/or firmware elements that are cooperatively configured to provide the described operations.

Figure 2:
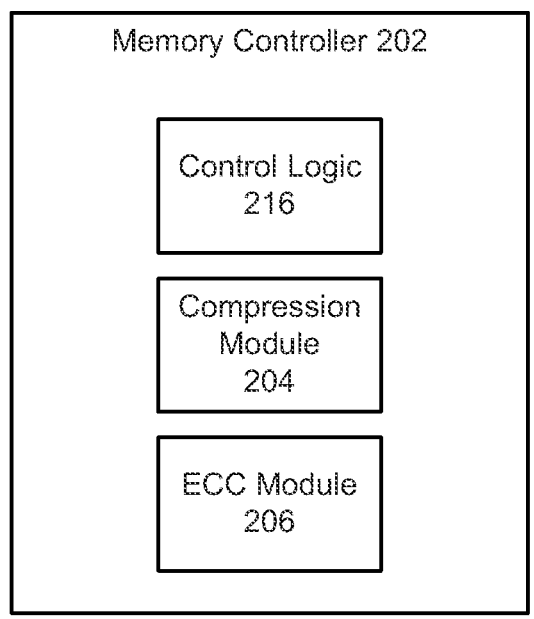
FIG. 2 illustrates a memory controller configured for compression-enabled blending data.

Although the compression module 104 and the ECC module 106 are depicted in FIG. 1 as being separate from the memory controller 102, other implementations may be possible. As shown in FIG. 2, for example, various embodiments of a memory controller 202 may include control logic 216 along with a compression module 204 and/or an ECC module 206 in the memory controller 202 itself.

Referring again to FIG. 1, the NVM 112 may include an array of NVM devices (e.g., chips) comprising non-volatile memory cells. The NVM 112 may comprise NAND flash memory. In other embodiments, the NVM 112 comprises NOR flash memory or phase-change memory. For embodiments in which the NVM 112 comprises phase-change memory, the phase-change memory cells may comprise vertically integrated memory cells in which a phase-change memory element is layered with an Ovonic Threshold Switch (OTS) in a cross-point array (a phase change memory with switch (PCMS) device).

The NVM 112 may comprise single-level memory cells (1 bit per cell), multi-level memory cells (2 bits per cell), triple-level memory cells (3 bits per cell), or memory cells configured to store more than 3 bits per cell, or a combination thereof. In various embodiments, the NVM 112 may include triple-level memory cells configured to selectively operate in any one or more of single-level cell mode, multi-level cell mode, and triple-level cell mode. In other embodiments, the NVM 112 may include multi-level memory cells configured to selectively operate in the single-level cell mode or the multi-level cell mode.

In various embodiments, the device 100 and may be configured to change between modes on the fly. In various ones of these embodiments, the memory controller 102 may be configured to send a command to the NVM 112 to change the mode from one mode to another, prior to writing data to the NVM 112. The command may have the effect of changing the mode of the entire NVM 112, or a portion (e.g., one or more blocks) of the NVM 112. In various embodiments, the memory controller 102 may be configured to check the mode of the NVM 112 before subsequent write(s) to the NVM 112 to determine whether to change modes, and to command the NVM 112 to change mode. In various ones of these embodiments, the memory controller 102 may determine that a mode change is needed based at least in part on the quantity of data to be written relative to the storage capacity of the NVM 112, for example.

The device 100 may be a solid-state drive (SSD), which may be configured to be coupled with a host device 114, including, but not limited to, various computing and/or consumer electronic devices/appliances, such as desktop, laptop, or tablet computers. To that end, the interface 115 may comprise any suitable interface for coupling the device 100 to the host device 114, such as, for example, but not limited to, a serial advanced technology attachment (SATA) interface, a serial attached SCSI (SAS) interface, a universal serial bus (USB) interface, a peripheral control interface (PCI), or other suitable device interface.

The memory controller 102 may be configured to access the NVM 112 based on a memory access request (a request to write data from a host device 114, for example), and in various embodiments, the memory controller 102 may be configured to write data to the NVM 112. In various embodiments, the compression module 104 may be configured to receive data and compress the data to generate compressed data, which may then be written to the NVM 112 by the memory controller 102. The compression module 104 may be capable of using any compression technique. Example compression techniques may include, but are not limited to, Lempel-Ziv (LZ)-type compression or data deduplication compression. In various embodiments, the compression module 104 may be further configured to decompress the compressed data (on read, for example).

In various embodiments, the ECC module 106 may be configured to encode data to be written to generate encoded data. The encoded data may include ECC codeword(s) (i.e., check bits or parity bits) that may be used to facilitate identifying and correcting errors in the data. The memory controller 102 may be configured to write the ECC codeword(s) when writing the data to the NVM 112. In various embodiments, the ECC module 106 may encode the data after the data has been compressed by the compression module 104. In other embodiments, the ECC module 106 may encode the data before the data has been compressed by the compression module 104.

The memory controller 102 may be configured to write data to the NVM 112 in a blended manner such that portions of data are written to the NVM 112 in different modes (e.g., single-level cell mode, multi-level cell mode, triple-level cell mode, etc.). In various embodiments, the NVM 112 may be a block-based memory, and in these embodiments, data may be written to a block of the NVM 112 in one mode, but may be written to another block of the NVM 112 in the same mode or a different mode. In various embodiments, the memory controller 102 may configure the mode for the individual blocks, and determine when to change the mode for the individual blocks.

For example, in various embodiments, the memory controller 102 may be configured to write a first portion of data to one or more first blocks of the NVM 112 in a single-level cell (SLC) mode, and a second portion of the data to one or more second blocks in a multi-level cell (MLC) mode or triple-level cell (TLC) mode. In various embodiments, the memory controller 102 may be configured to write a first portion of data to one or more first blocks in a SLC mode, a second portion of the data to one or more second blocks in a MLC mode, and a third portion of the data to one or more third blocks in a TLC mode. In various embodiments, the memory controller 102 may write data that has been compressed (compressed data) and/or encoded in this blended manner.

By writing data in a blended manner, a portion of the NVM 112 may be used in the SLC mode and a portion of the NVM 112 may be used in the MLC and/or TLC mode. As noted elsewhere, although SLC mode tends to have a higher endurance and operate faster in terms of access speed, the SLC mode also has less storage capacity versus the MLC and TLC modes. This lower capacity effectively results in an extra cost per unit of data. Blending, therefore, may provide a good balance between speed/endurance and capacity.

In various embodiments, compressing data prior to writing to the NVM 112 may reduce the total size of data to be written to the NVM 112, which may in turn allow for tuning of the ratio of SLC memory to MLC and/or TLC memory used for writing the compressed data. To that end, in various embodiments, the memory controller 102 may be configured to determine whether a reduction ratio of the compressed data is greater than (or greater than or equal to) a threshold compression ratio. In various embodiments, the threshold compression ratio may be some predetermined compression ratio, which may be based on the number of modes in which the NVM 112 is configured to operate. For example, for a NVM configured to operate in SLC, MLC, and TLC modes, the threshold compression ratio of original data size to compressed data size ratio may be set at 3 as TLC is capable of storing 3 times more than SLC. In this example, therefore, a reduction ratio greater than or equal to 3 may indicate that the data may be entirely written to the NVM 112 in SLC mode. In other words, if data in its uncompressed form could be written to a particular area of the NVM 112 in the TLC mode, but could be compressed to ⅓ or smaller of its original size, then the compressed data could be written entirely in the faster SLC mode instead.

If the memory controller 102 determines, on the other hand, that the reduction ratio of the compressed data is less than (or less than or equal to) the threshold compression ratio, the compressed data may be written to the NVM 112 is a blended manner to take advantage of the speed/endurance/capacity trade-off.

Although MLC and TLC memory may offer greater storage capacity than SLC, MLC and TLC may tend to be more prone to errors and may suffer lower endurance than SLC memory. In various embodiments, the endurance and reliability of the storage device 102 may be improved by using increased strength ECC codewords. In these embodiments, the ECC module 106 may be configured to add parity byte(s) to the ECC codeword(s) of the data or applying the codeword(s) over a smaller payload. In various embodiments, the number and granularity of the added parity bytes can be pre-determined for one or more compression ratios. Although adding parity bytes may require more spare area in the NVM 112, a modest compression of the data may provide enough freeing up of area of the NVM 112 to write the added parity bytes. In some embodiments, for example, the area requirement for the added parity bytes could be in the range of 2-9%, and in some embodiments, 2-9% may be less than needed for blending into a higher-performing mode but may be enough to improve the endurance and reliability of the NVM 112 by using the added parity bytes in the ECC codeword(s) for the data.

Figure 3:
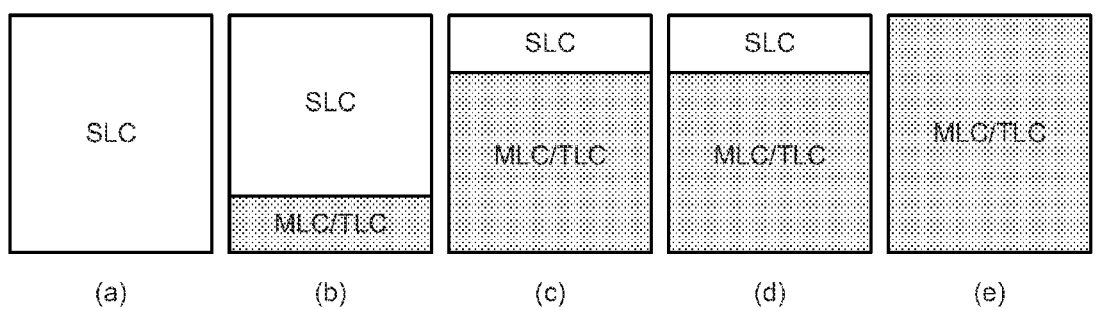
FIG. 3 depicts various states of a compression-enabled storage device.

The compression-enabled blending concept may be understood more clearly with reference to FIG. 3. FIG. 3 shows the NVM 112 operating under different examples of compression-enabled blending scenarios. In the scenarios, it is assumed the NVM 112 is capable of operating in the SLC, MLC, and TLC modes.

Under scenario (a), the data is highly compressible (e.g., original size to compressed size ratio is greater than 3) and thus the entire memory area is operating in the SLC mode (fastest/highest endurance memory mode).

Under scenario (b), the data is moderately compressible (e.g., original size to compressed size ratio is greater than 1 but less than 3) and thus most of the memory is operating in the SLC mode and some of the memory is operating in the MLC mode and/or TLC mode.

Under scenario (c), the data is slightly compressible and blending is used so that some of the memory is operating in the SLC mode and most of the memory is operating in the MLC and/or TLC mode. In this scenario, enough compression is achieved to use higher-strength ECC codeword(s) (i.e., ECC codeword(s) with added parity byte(s)).

Under scenario (d), the data is not compressed, but blending is used. As shown, some portion of the memory can be sacrificed for increasing the speed, but the higher-strength ECC codeword(s) are not used.

Under scenario (e), the data is incompressible (e.g., original size to compressed size ratio is equal to 1) and the entire memory is used TLC mode without blending. This scenario may be less desirable than compression-enabled blending scenarios at least in that the entire memory area is being used in the slowest/lowest endurance TLC mode.

Figure 4:
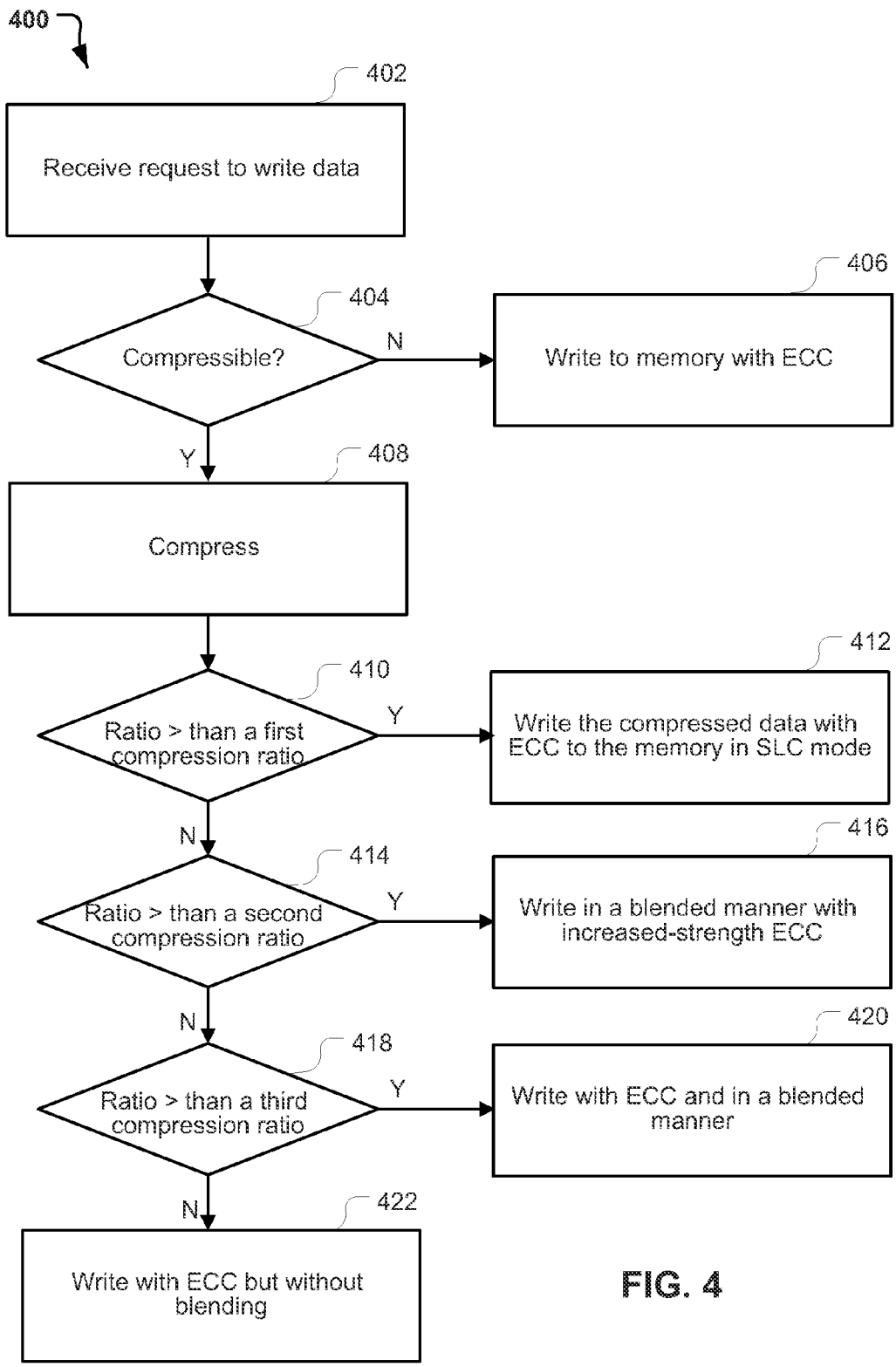
FIG. 4 is a flow chart depicting a compression-enabled blending method.

FIG. 4 is a flow chart depicting a compression-enabled blending method 400, which may be performed by a storage device in accordance with the embodiments described herein. The method 400 may include one or more functions, operations, or actions as is illustrated by block 402, 404, 406, 408, 410, 412, 414, 416, 418, 420, and/or block 422.

Processing for the method 400 may start with block 402 by receiving a request to write data. In various embodiments, the request may be received from a host device.

The method 400 may proceed to block 404 by determining whether the data is compressible. The determining may be performed using any suitable technique, which may or may not include attempting a compression of the data and making the determination depending on the result of the attempted compression. If the data is determined to be incompressible, the method 400 may proceed to block 406 by writing the data to memory without compressing the data. In various embodiments, the data may be written with ECC codeword(s). The ECC codeword(s) may be native form ECC (i.e., not strengthened as described herein). In various embodiments, the data may be written in a blended manner or without blending. In various ones of these embodiments, data blending may be a global option, which would be either enabled or disabled, and may be based at least in part on the performance requirements (e.g., blending enabled=higher performance, blending disabled=lower performance, etc.). In various ones of these embodiments, if blending is enabled, the data may be written to memory at block 406 with blending, no compression, and with native-form ECC, or proceed to block 408 for data that is compressible. If, on the other hand, blending is disabled, data may be written to memory at block 406 with native-form ECC and without blending. In various ones of these latter embodiments, all data may be written to memory at block 406 with native-form ECC and without blending—until such time blending is enabled.

If the data is determined to be compressible, the method 400 may proceed to block 408 by compressing the data.

The method 400 may proceed to block 410 by determining whether the reduction ratio of the compressed data is greater than (or greater than or equal to) a first threshold compression ratio.

If the reduction ratio of the compressed data is greater than (or greater than or equal to) the first threshold compression ratio, the method 400 may proceed to block 412 by writing the compressed data to the memory in the SLC mode. In various embodiments, the data may be written with ECC codeword(s). The ECC codeword(s) may be native-form ECC (i.e., not strengthened as described herein).

If the reduction ratio of the compressed data less than (or less than or equal to) the first threshold compression ratio, the method 400 may proceed to block 414 by determining whether the reduction ratio of the compressed data is greater than (or greater than or equal to) a second threshold compression ratio. In various embodiments, the second threshold compression ratio may be less than the first threshold compression ratio.

If the reduction ratio of the compressed data is greater than (or greater than or equal to) the second threshold compression ratio, the method 400 may proceed to block 416 by writing the compressed data to the memory in a blended manner with increased-strength ECC. In various ones of these embodiments, a first portion of the compressed data may be written to memory in SLC mode, and a second portion of the compressed data may be written to the memory in MLC mode and/or TLC mode. In embodiments in which the second portion of the compressed data is written to memory in MLC mode, a third portion of the compressed data may be written to the memory in TLC mode. In various embodiments, the first portion may be written to a first block of the memory, the second portion may be written to a second block of the memory, and the third portion (when present) may be written to a third block of the memory. As described elsewhere, an increased-strength ECC may include additional parity byte(s) or may be an ECC applied over a smaller payload. In various embodiments, the number and granularity of the added parity bytes can be based at least in part on the degree of compression (e.g., the compression ratio).

If the reduction ratio of the compressed data less than (or less than or equal to) the second threshold compression ratio, the method 400 may proceed to block 418 by determining whether the reduction ratio of the compressed data is greater than (or greater than or equal to) a third threshold compression ratio. In various embodiments, the third threshold compression ratio may be less than the second threshold compression ratio.

If the reduction ratio of the compressed data is greater than (or greater than or equal to) the third threshold compression ratio, the method 400 may proceed to block 420 by writing the compressed data to the memory with native-form ECC and in a blended manner. In various embodiments, the data is written without increased-strength ECC.

If the reduction ratio of the compressed data less than (or less than or equal to) the third threshold compression ratio, the method 400 may proceed to block 422 by writing the compressed data with native-form ECC but without blending. In various embodiments, the data is written without increased-strength ECC.

In one embodiment, the method of FIG. 4 can be performed by executing machine-readable instructions by a processor (such as, for example, a memory processor like the memory processor 108 described with reference to FIG. 1), wherein the machine-readable instructions are stored on a non-transitory machine-readable storage medium (e.g., a flash memory, a dynamic random access memory, a static random access memory, etc.) coupled to the processor.

Figure 5:
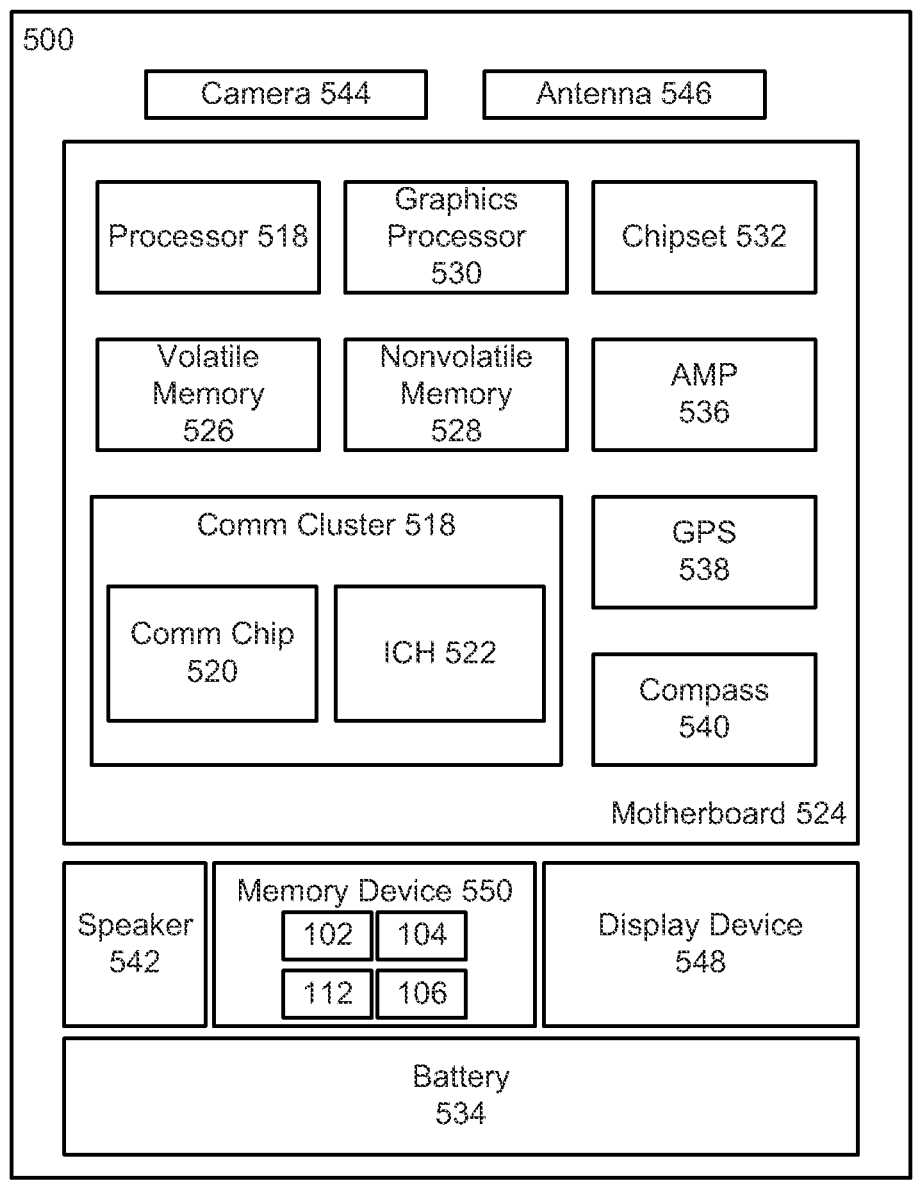
FIG. 5 is a block diagram of a system incorporating a storage device configured for compression-enabled blending of data.

Embodiments of the storage devices described herein (such as storage device 100, for example) may be stand-alone devices or may be incorporated into various apparatuses or systems including, but not limited to, various computing and/or consumer electronic devices/appliances. A system level block diagram of an example system 500 is illustrated in FIG. 5. In various embodiments, the system 500 may include more or fewer components, and/or different architectures than that shown in FIG. 5.

In various implementations, the system 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 500 may be any other electronic device that processes data.

The system 500 may include a storage device 550. The storage device 550 may be similar to the storage devices described herein. The storage device 550 may include, for example, a memory controller 102, a compression module 104, and an ECC module 106. The memory controller 102 may be coupled with NVM 112 and may be configured to perform various operations of the compression-enabled blending of data described herein.

The storage device 550 may be an SSD, which may be configured to be coupled with a motherboard 524 of the system 500 via any suitable interface. Example interfaces may include, but are not limited to, a SATA interface, an SAS interface, a USB interface, a PCI interface, or other suitable device interface.

In various embodiments, the processor 524 may be physically and electrically coupled with the motherboard 524. Depending on its applications, the system 500 may include other components that may or may not be physically and electrically coupled to the motherboard 524. These other components include, but are not limited to, volatile memory 526 (e.g., dynamic random access memory (DRAM)), non-volatile memory 528 (e.g., read only memory (ROM)), flash memory, a graphics processor 530, a digital signal processor, a crypto processor, a chipset 532, a battery 534, an audio codec, a video codec, a power amplifier 536, a global positioning system (GPS) device 538, a compass 540, an accelerometer, a gyroscope, a speaker 542, a camera 544, an antenna 546, and a mass storage device (such as hard disk drive, compact disk (CD), digital versatile disk (DVD), and so forth).

The system 500 may include a communications cluster 518 operatively to facilitate communication of the system 500 over one or more networks and/or with any other suitable device. The communications cluster 518 may include at least one communication chip 520 and at least one I/O controller hub 522. In some implementations, the at least one I/O controller hub 522 may be part of the at least one communication chip 520. In some implementations the at least one communication chip 520 may be part of the processor 518.

The communication chip 520 may enable wireless communications for the transfer of data to and from the system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 520 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 2G, 3G, 4G, 5G, and beyond. The system 500 may include a plurality of communication chips 520. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The system 500 may include a display device 548, such as, for example, a cathode ray tube (CRT), liquid crystal display (LCD), light emitting diode (LED), or other suitable display device. The display device 548 may be a touch screen display supporting touch screen features, and in various one of these embodiments, the I/O controller hub 522 may include a touchscreen controller. In various embodiments, the display device 548 may be a peripheral device interconnected with the system 500.

The following paragraphs describe various embodiments.

In various embodiments, an apparatus configured for compression-enabled blending storage of data in non-volatile memory may comprise non-volatile memory configured to operate in a single-level cell mode and a multi-level cell mode, a compression module configured to compress data to generate compressed data, and a memory controller configured to write, in response to a reduction ratio of the compressed data being less than a threshold compression ratio, a first portion of the compressed data to the non-volatile memory in the single-level cell mode, and a second portion of the compressed data to the non-volatile memory in the multi-level cell mode.

In various embodiments, the memory controller is configured to write, in response to the reduction ratio of the compressed data being greater than the threshold compression ratio, the compressed data to the non-volatile memory in the single-level cell mode.

In various embodiments, the data comprises first data and wherein the compression module is configured to compress second data to generate compressed second data, and wherein the memory controller is further configured to write, in response to a reduction ratio of the compressed second data being greater than the threshold compression ratio, the compressed second data to the non-volatile memory in the single-level cell mode.

In various embodiments, the apparatus includes an error correction code (ECC) module configured to encode the data with an ECC codeword. In various ones of these embodiments, the ECC module is further configured to increase the strength of the ECC codeword, in response to the reduction ratio of the compressed data being less than the threshold compression ratio. In various embodiments, the memory controller is further configured to write, in response to the reduction ratio of the compressed data being less than the threshold compression ratio, the increased-strength ECC codeword to the non-volatile memory.

In various embodiments, the memory comprises a plurality of single-level memory cells configured to operate in the single-level cell mode and a plurality of multi-level memory cells configured to operate in the multi-level cell mode. In various ones of these embodiments, the non-volatile memory further comprises a plurality of triple-level memory cells configured to operate in a triple-level cell mode. In various embodiments, the memory controller is further configured to write, in response to the reduction ratio of the compressed data being less than the threshold compression ratio, a third portion of the compressed data to the non-volatile memory in the triple-level cell mode.

In various embodiments, the non-volatile memory comprises NAND flash memory.

All optional features of the apparatuses described above may also be implemented with respect to various non-transitory machine-readable media described herein. For example, in various embodiments, a non-transitory machine-readable medium may have associated instructions that, when executed by a machine, result in operations including compressing data to generate compressed data, and in response to a reduction ratio of the compressed data being less than a threshold compression ratio, writing a first portion of the compressed data to non-volatile memory in a single-level cell mode, and a second portion of the compressed data to the non-volatile memory in a multi-level cell mode.

In various embodiments, the operations further include, in response to the reduction ratio of the compressed data being greater than the threshold compression ratio, writing the compressed data to the non-volatile memory in the single-level cell mode.

In various embodiments, the data comprises first data and wherein the operations further include compressing second data to generate compressed second data, and, in response to a reduction ratio of the compressed second data being greater than the threshold compression ratio, writing the compressed second data to the non-volatile memory in the single-level cell mode.

In various embodiments, the data comprises data encoded with an error correction code (ECC) codeword. In various ones of these embodiments, the operations further include, in response to the reduction ratio of the compressed data being less than the threshold compression ratio, increasing the strength of the ECC codeword, and wherein the writing comprises writing the increased-strength ECC codeword to the non-volatile memory.

In various embodiments, the operations further include, in response to the reduction ratio of the compressed data being less than the threshold compression ratio, writing a third portion of the compressed data to the non-volatile memory in a triple-level cell mode.

All optional features of the apparatuses and/or media described above may also be implemented with respect to various systems described herein. For example, in various embodiments, a system comprises a solid-state drive configured for compression-enabled blending storage of data in non-volatile memory, a host configured to issue a memory access request to the solid-state drive, and a display device operatively coupled with the solid-state device and the network interface. In various ones of these embodiments, the solid-state drive includes non-volatile memory configured to operate in a single-level cell mode and a multi-level cell mode, a compression module configured to compress data to generate compressed data, and a memory controller configured to write, in response to a reduction ratio of the compressed data being less than a threshold compression ratio, a first portion of the compressed data to the non-volatile memory in the single-level cell mode, and a second portion of the compressed data to the non-volatile memory in the multi-level cell mode.

In various embodiments, the memory controller is further configured to write, in response to the reduction ratio of the compressed data being greater than the threshold compression ratio, the compressed data to the non-volatile memory in the single-level cell mode.

In various embodiments, the solid-state drive includes an error correction code (ECC) module configured to encode the data with an ECC codeword. In various ones of these embodiments, the ECC module is further configured to increase the strength of the ECC codeword, in response to the reduction ratio of the compressed data being less than the threshold compression ratio. In various embodiments, the memory controller is further configured to write, in response to the reduction ratio of the compressed data being less than the threshold compression ratio, the increased-strength ECC codeword.

In various embodiments, the non-volatile memory comprises a plurality of single-level memory cells configured to operate in the single-level cell mode and a plurality of multi-level memory cells configured to operated in the multi-level cell mode. In various ones of these embodiments, the non-volatile memory comprises a plurality of triple-level memory cells configured to operate in a triple-level cell mode. In various embodiments, the memory controller is further configured to write, in response to the reduction ratio of the compressed data being less than the threshold compression ratio, a third portion of the compressed data to the non-volatile memory in the triple-level cell mode.

In various embodiments, the non-volatile memory comprises NAND flash memory.

In various embodiments, the system further comprises a network interface operatively coupled with the solid-state drive and configured to communicatively couple the system with a network.

In various embodiments, the system is a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video recorder.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
a compression module configured to compress data to generate compressed data; and
a memory controller configured to write, in response to a reduction ratio of the compressed data being less than a threshold compression ratio, a first portion of the compressed data to a non-volatile memory in a single-level cell mode, and a second portion of the compressed data to the non-volatile memory in a multi-level cell mode.

2. The apparatus of claim 1, wherein the memory controller is further configured to write, in response to the reduction ratio of the compressed data being greater than the threshold compression ratio, the compressed data to the non-volatile memory in the single-level cell mode.

3. The apparatus of claim 1, wherein the data comprises first data and wherein the compression module is configured to compress second data to generate compressed second data, and wherein the memory controller is further configured to write, in response to a reduction ratio of the compressed second data being greater than the threshold compression ratio, the compressed second data to the non-volatile memory in the single-level cell mode.

4. The apparatus of claim 1, further comprising an error correction code (ECC) module configured to encode the data with an ECC codeword.

5. The apparatus of claim 4, wherein the ECC module is further configured to increase the strength of the ECC codeword, in response to the reduction ratio of the compressed data being less than the threshold compression ratio.

6. The apparatus of claim 5, wherein the memory controller is further configured to write, in response to the reduction ratio of the compressed data being less than the threshold compression ratio, the increased-strength ECC codeword to the non-volatile memory.

7. The apparatus of claim 1, wherein the memory comprises a plurality of single-level memory cells configured to operate in the single-level cell mode and a plurality of multi-level memory cells configured to operate in the multi-level cell mode.

8. The apparatus of claim 7, wherein the non-volatile memory further comprises a plurality of triple-level memory cells configured to operate in a triple-level cell mode.

9. The apparatus of claim 8, wherein the memory controller is further configured to write, in response to the reduction ratio of the compressed data being less than the threshold compression ratio, a third portion of the compressed data to the non-volatile memory in the triple-level cell mode.

10. The apparatus of claim 1, wherein the non-volatile memory comprises NAND flash memory.

11. A system comprising:
a solid-state drive including:
non-volatile memory configured to operate in a single-level cell mode and a multi-level cell mode;
a compression module configured to compress data to generate compressed data; and
a memory controller configured to write, in response to a reduction ratio of the compressed data being less than a threshold compression ratio, a first portion of the compressed data to the non-volatile memory in the single-level cell mode, and a second portion of the compressed data to the non-volatile memory in the multi-level cell mode;
a host configured to issue a memory access request to the solid-state drive; and
a display device operatively coupled with the solid-state device and the network interface.

12. The system of claim 11, wherein the memory controller is further configured to write, in response to the reduction ratio of the compressed data being greater than the threshold compression ratio, the compressed data to the non-volatile memory in the single-level cell mode.

13. The system of claim 11, wherein the solid-state drive includes an error correction code (ECC) module configured to encode the data with an ECC codeword.

14. The system of claim 13, wherein the ECC module is further configured to increase the strength of the ECC codeword, in response to the reduction ratio of the compressed data being less than the threshold compression ratio.

15. The system of claim 14, wherein the memory controller is further configured to write, in response to the reduction ratio of the compressed data being less than the threshold compression ratio, the increased-strength ECC codeword.

16. The system of claim 11, wherein the non-volatile memory comprises a plurality of single-level memory cells configured to operate in the single-level cell mode and a plurality of multi-level memory cells configured to operated in the multi-level cell mode.

17. The system of claim 16, wherein the non-volatile memory comprises a plurality of triple-level memory cells configured to operate in a triple-level cell mode.

18. The system of claim 17, wherein the memory controller is further configured to write, in response to the reduction ratio of the compressed data being less than the threshold compression ratio, a third portion of the compressed data to the non-volatile memory in the triple-level cell mode.

19. The system of claim 11, wherein the non-volatile memory comprises NAND flash memory and further comprising a network interface operatively coupled with the solid-state drive and configured to communicatively coupled the system with a network.

20. A non-transitory machine-readable medium having associated instructions that, when executed by a machine, result in operations including:
compressing data to generate compressed data; and
in response to a reduction ratio of the compressed data being less than a threshold compression ratio, writing a first portion of the compressed data to non-volatile memory in a single-level cell mode, and a second portion of the compressed data to the non-volatile memory in a multi-level cell mode.

21. The non-transitory machine-readable medium of claim 20, wherein the operations further include, in response to the reduction ratio of the compressed data being greater than the threshold compression ratio, writing the compressed data to the non-volatile memory in the single-level cell mode.

22. The non-transitory machine-readable medium of claim 20, wherein the data comprises first data and wherein the operations further include:
compressing second data to generate compressed second data; and
in response to a reduction ratio of the compressed second data being greater than the threshold compression ratio, writing the compressed second data to the non-volatile memory in the single-level cell mode.

23. The non-transitory machine-readable medium of claim 20, wherein the data comprises data encoded with an error correction code (ECC) codeword.

24. The non-transitory machine-readable medium of claim 23, wherein the operations further include, in response to the reduction ratio of the compressed data being less than the threshold compression ratio, increasing the strength of the ECC codeword, and wherein the writing comprises writing the increased-strength ECC codeword to the non-volatile memory.

25. The non-transitory machine-readable medium of claim 20, wherein the operations further include, in response to the reduction ratio of the compressed data being less than the threshold compression ratio, writing a third portion of the compressed data to the non-volatile memory in a triple-level cell mode.

* * * * *